United States Patent [19]

Craker

[11] Patent Number: 4,716,497
[45] Date of Patent: Dec. 29, 1987

[54] PRINTED CIRCUIT BOARD MODULE

[75] Inventor: Robert Craker, Painesville, Ohio

[73] Assignee: Allen-Bradley Company, Inc., Milwaukee, Wis.

[21] Appl. No.: 909,714

[22] Filed: Sep. 22, 1986

[51] Int. Cl.$^4$ .............................................. H05K 1/14
[52] U.S. Cl. ...................................... 361/395; 361/399; 361/400
[58] Field of Search ............... 361/393, 395, 412, 413, 361/399, 400, 394; 211/41

[56] References Cited

U.S. PATENT DOCUMENTS

| | | | |
|---|---|---|---|
| 3,465,891 | 9/1969 | De Rose | 211/41 |
| 3,500,131 | 3/1970 | Seeley et al. | 361/415 |
| 3,691,430 | 9/1972 | Freitag | 211/41 X |
| 3,729,657 | 4/1973 | Callan | 339/17 L X |
| 3,992,654 | 11/1976 | Springer et al. | 339/4 X |
| 4,151,580 | 4/1979 | Struger et al. | 361/415 |
| 4,152,750 | 5/1979 | Bremenour et al. | 361/383 |
| 4,302,820 | 11/1971 | Struger et al. | 364/900 |

Primary Examiner—J. R. Scott
Assistant Examiner—Morris Ginsburg
Attorney, Agent, or Firm—Quarles & Brady

[57] ABSTRACT

A printed circuit board module consists of a first printed circuit board with a nonconductive panel connected to the foil side of the board. Extending parallel to and spaced from the first printed circuit board is a frame having a number of standoffs connected to the first printed circuit board and its insulating panel. A frame insert consisting of a nonconductive panel to which a second printed circuit board is fastened is removably positioned within the central opening of the frame. Two opposed inner edges of the frame have two sets of spaced support tabs. The two sets of tabs are parallel to one another and staggered so as to form a channel therebetween. The corresponding edges of the frame insert have a plurality of aligned locking tabs so dimensioned and positioned as to fit between adjacent locking tabs in one set and slide along the channel to retain the insert within the frame. An additional locking mechanism is provided to prevent the frame insert so retained from sliding along the channel into the position at which it may be released from the frame.

16 Claims, 6 Drawing Figures

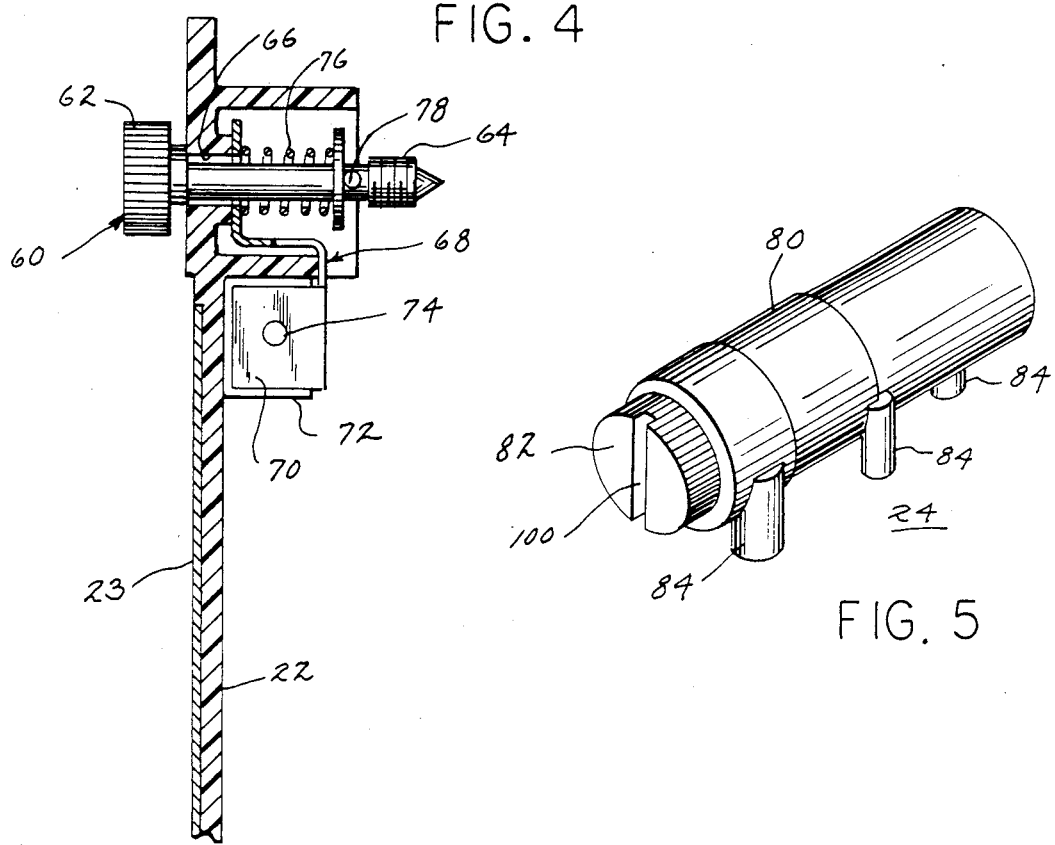
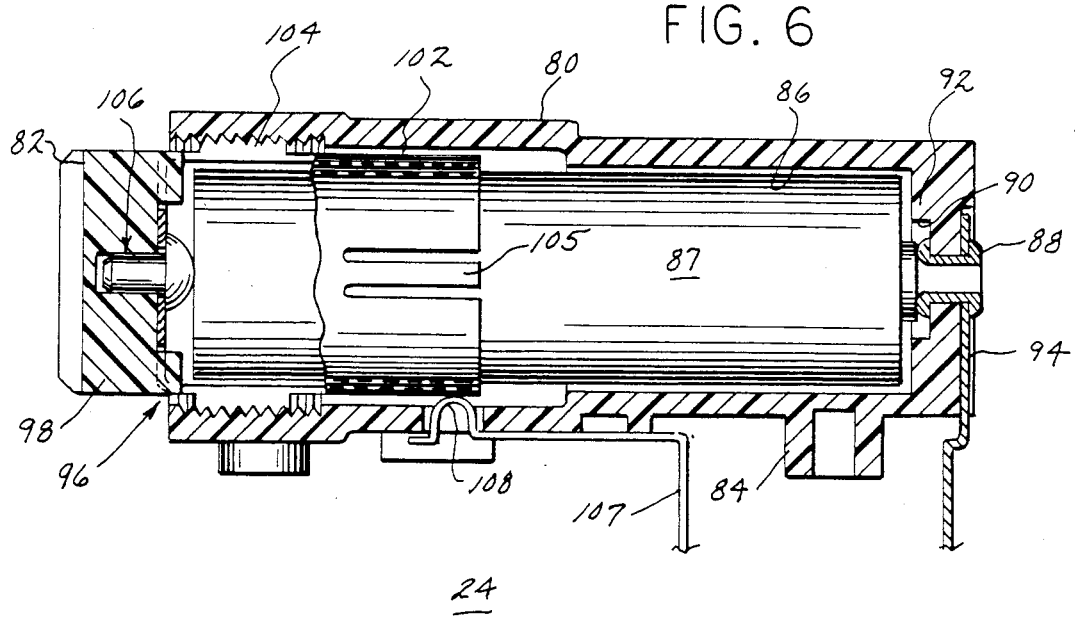

PRINTED CIRCUIT BOARD MODULE

BACKGROUND OF THE INVENTION

The present invention relates to printed circuit board assemblies for mounting in a rack enclosure.

Complex electrical apparatus often consists of a plurality of printed circuits boards which must be electrically interconnected and mechanically supported. One such technique for accomplishing this is shown in U.S. Pat. No. 4,302,820 issued to Odo J. Struger, et al. In the first figure of that patent, a rack enclosure is shown into which plug a number of printed circuit board assemblies designated 15-18. Typically, the rack enclosure has a backplane printed circuit board having a series of connectors which mate with connectors on each of the printed circuit boards. The front edge of the printed circuit boards may also contain indicator lights, additional electrical connectors for external devices, and switches.

In a variation of this basic enclosure structure is shown in my copending U.S. patent application, Ser. No. 909,710 filed on an even date herewith and entitled, "Printed Circuit Board Chassis with Electrical Interlock." In that structure, the enclosure includes upper and lower guide tracks for guiding each printed circuit board into the backplane connectors and upper and lower grounding bars into which a front panel of the printed circuit board module may be attached by bolts.

Typically, each printed circuit board assembly consists of only a single printed circuit board which had to be spaced some distance away from the adjacent printed circuit boards in order to provide electrical isolation of the various components and conductive paths on the printed circuit board so that the vibration of the enclosure would not cause two adjacent printed circuit boards or their components to come into contact with one another.

SUMMARY OF THE INVENTION

A printed circuit board module includes a first printed circuit board assembly spaced from and parallel to a printed circuit board frame. A frame insert is removably held within the frame and a second printed circuit board is attached to the frame insert. In one specific implementation of the present invention, the frame has a plurality of aligned support tabs spaced from one another along each of two opposed interior edges of the frame. At least one other projection extends from each of the opposed interior edges spaced from support tabs to form a channel extending longitudinally along the edges of the frame. In this embodiment the frame insert has two opposed edges which when assembled into the frame are adjacent to the interior edges. The insert edges each have at least one locking tab having a thickness which is less than the width of the defined channel on the interior edge of the frame so as to permit the insert to slide along the channel. Additional means may be provided for preventing the frame insert from moving along the channel to a position where it may be removed from the frame, when removal is not desired.

The present invention provides a printed circuit board module that may include two interconnected printed circuit boards. One of said boards may be easily removed from the module for replacement when the components on the board become defective. A keying mechanism may also be provided to insure that only the proper replacement board is inserted in the module.

BRIEF DESCRIPTION OF THE DRAWINGS

FIG. 4 is a cross sectional view of part of the front panel of the module in FIG. 1.

FIG. 5 is a perspective view of a battery holder for the module; and,

FIG. 6 is a longitudinal cross section of the battery holder.

DETAILED DESCRIPTION OF THE PREFERRED EMBODIMENT

Figure 1:
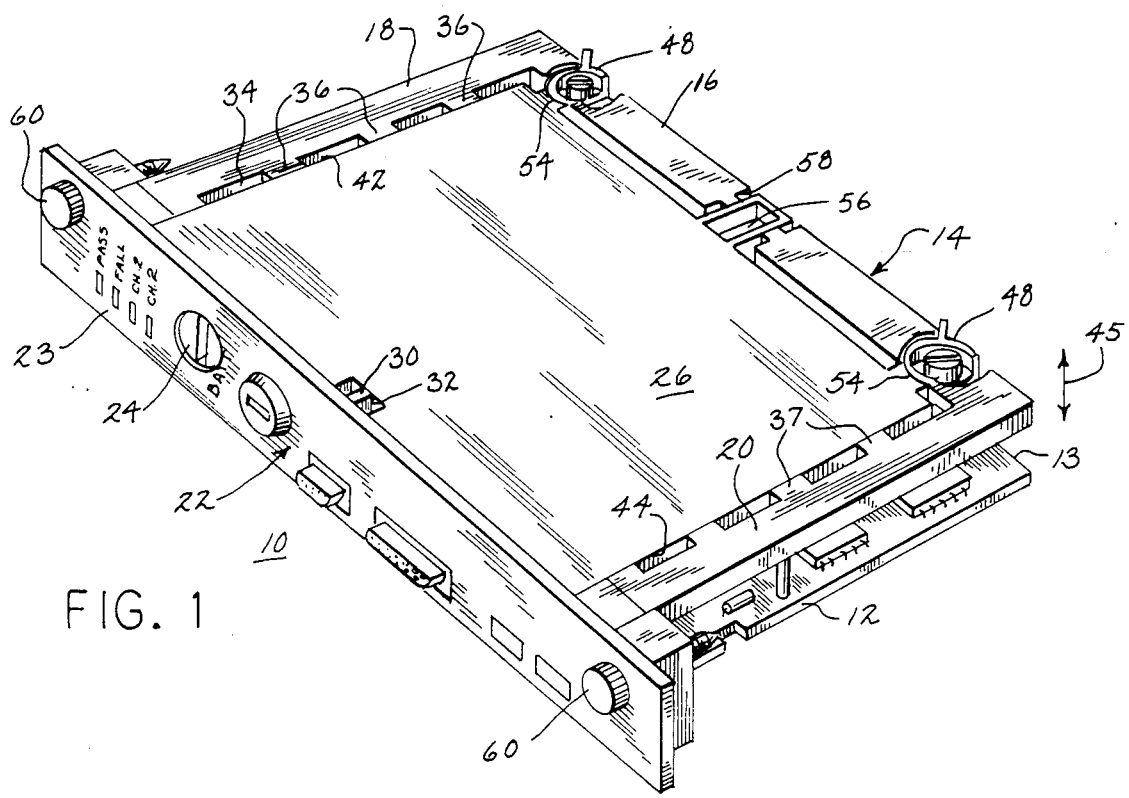
FIG. 1 is a perspective view of a printed circuit board module according to the present invention.

In FIG. 1 a printed circuit board module, generally designated 10, has a first printed circuit board 12 which may have a thin panel attached to its underside (not shown) to provide electrical insulation of the foil pattern on that side of the printed circuit board 12. Spaced from the first printed circuit board and parallel to it is a frame 14 consisting of a central connecting member 16 from which two legs 18 and 20 orthogonally extend to form a squared C-shaped frame. A front faceplate panel 22 of the module extends across the open portion of the C-shaped frame 14 and is fastened to ends of both frame legs 18 and 20 and the first printed circuit board 12. Alternatively, the frame could include a member extending between the ends of the legs along the front panel. The front panel is also fastened to one edge of the first printed circuit board 12. The front panel contains various indicator lights, external electrical connectors and a battery holder 24 extending through an aperture in the front panel. The rear edge 13 of the printed circuit board 12 has electrical connectors (not shown) to couple with a chassis into which the module 10 may be placed.

Figure 3:
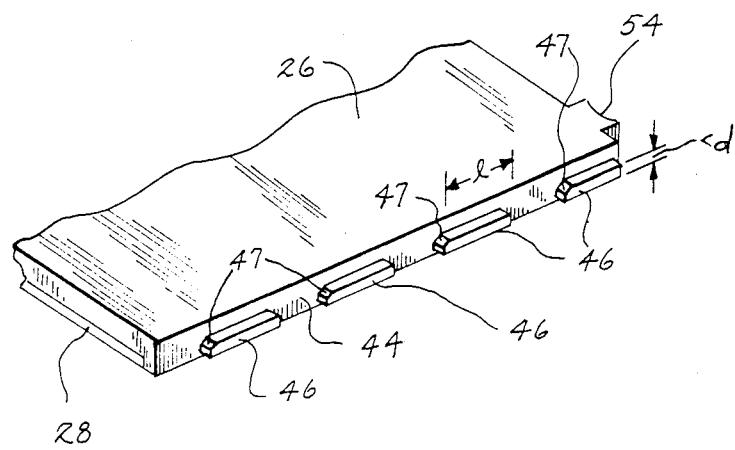
FIG. 3 is an enlarged detailed view of the edge of the framed insert of FIG. 1.

Held within the central opening of frame 14 is a rectangular frame insert 26. A second printed circuit board 28 is fastened to the underside of the frame insert 26 (As shown in FIG. 3). The second printed circuit board 28 may be electrically connected to the first printed circuit board 12 by means of a ribbon cable with connectors on each end extending between the two printed circuit boards (not shown). The front edge of the frame insert 26 abuts the rear surface of the front panel 22. A key 30 extends from the rear surface of the front panel 22 into the central opening of the frame 14. The frame insert 26 has a notch 32 along its front edge into which the front panel key 30 fits when the frame insert 26 is against the rear surface of the panel. The position of the key 30 and notch 32 may be located anywhere along the length of front panel 22. Different modules may have the key and notch in different positions so that a frame insert 26 for one type of module cannot be inserted into another type of module.

Figure 2:
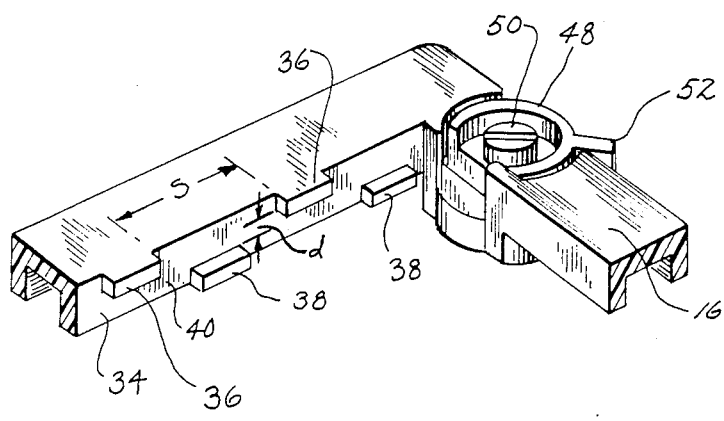
FIG. 2 is an enlarged portion of the frame of the printed circuit, board module at FIG. 1.

The insert 26 is held within the frame 14 by a series of tabs on some of the adjacent edges of the frame and the insert. With reference to FIGS. 1 and 2, the interior edge 34 of frame leg 18 has a first set of support tabs 36 extending inwardly from the interior edge and positioned along what is the upper surface of the leg 18 as the components are shown in the various figures. A second set of lower support tabs 38 also extend inwardly from the interior surface 34 of the first leg 18, but are close to the bottom surface of the leg. The tabs in each of these two sets 36 and 38 are spaced from one another a distance S. The support tabs of each set are staggered with respect to those of the other set to form a channel 40 extending the length of the leg 18 from the front panel 22 to the central member 16 between the two sets of tabs. The distance d between the two support tab sets defines the channel width. The interior edge of the other leg 20 which is opposed to the interior edge 34 of the first leg 18 also contains two similar sets of staggered spaced support tabs (only the upper tabs 37 being visible in FIG. 1).

The two opposite edges 42 and 44 of the frame insert 26 which are adjacent to the interior edges of the two frame legs 18 and 20 respectively, have a plurality of locking tabs 46 extending therefrom as shown in detail in FIG. 3. The locking tabs 46 have a length 1 along their respective edge of insert 26 which is slightly less than the spacing between the support tabs in one of the sets, for example, the spacing S between tabs 36 in FIG. 2. The thickness of the locking tabs in the vertical dimension of the FIG. 3 orientation of the insert 26 is slightly less than the distance d between the two sets of support tabs on the other leg 20 so as to permit sliding of the locking tabs 46 and the insert along the channel between the two sets of support tabs. The front edge of the tabs 46 has a bevel 47 to aid the sliding. The length of the locking tabs 46 is such that when one edge of the frame insert 26 is slid into contact with the rear surface of the front panel 22, each of the locking tabs 46 will be in contact with and engage tabs 36 and 38 in both sets of support tabs. In this position, the insert 26 is held within the frame and cannot move in directions 45 (FIG. 1).

A central gripping element 56 extends from the rear edge of the insert 26 into a channel 58 located in the central frame member 16. The gripping element 56 aids in sliding the insert 26 along channel 40 and lifting the insert out of the frame 14.

Alternatively, the second set of support tabs 38 could be replaced with a continuous tab-like ridge extending along at least a portion of each frame legs' 18 and 20 interior edge. The holding and support function provided by the plurality of support tabs 36 and 38 and locking tabs 46 also could be accomplished by a single tab 36 and 38 in each set and a corresponding locking tab 48 along each interface between the edges of the frame 26 and each of the legs 18 and 20. The number of tabs is a matter of a design choice to provide the desired degree of support for insert 26 within the frame 14.

If the insert 26 is slid along the channel 40 away from the front panel 22, the locking tabs 48 on the edges of the insert will be positioned between adjacent support tabs 36 along each of the frame legs 18 and 20. In this orientation the insert 26 and its printed circuit board 28 may be lifted out of the frame 14 and removed from the module.

In order to prevent the insert 26 from sliding away from the locking front panel 22 into a position in which it may be removed from the frame 14 during the operation of module 10, two D-shaped locking wheels 48 are positioned near the ends of the central member 16. Each of the wheels 48 is pivotally mounted to the central member 16 by a bolt 50. A Belleville spring washer (not shown) may be used between the head of each of the bolts 50 and the surface of the wheel 48 to bias the wheel against the surface of frame member 16 to prevent the movement of the wheels 50 due to vibration of the module 10. This vibrational movement can also be prevented by providing nipples on the underside of the wheels 48 and corresponding detents on the mating surface of the central member 16 (not shown). Extending from the curved surface of each of the wheels 48 is a finger tab 52 which facilitates the rotation of the wheel. Two locking protrusions 54 extend from the edge of the insert 26 adjacent to each of the locking wheels 48. The locking wheels 48 have two positions one in which the flat side of the D-shaped wheel is facing the inner opening of the frame 14 as shown in FIG. 2. In this position there is sufficient clearance between the wheels 48 and the protrusions 54 to permit the insert to slide along the channel 40 away from the front panel 22 so that the locking tabs 46 are in a position between adjacent support tabs 36. In this position the insert 26 may be removed from the frame. In the other position of the wheels as shown in FIG. 1, a portion of the curved surface is facing toward the inner opening of the frame 14 so that when the insert is contained within the frame and pushed against the front panel 22, the curved portion of the locking wheels 48 are against the protrusions 54 providing little or no clearance for the insert 26 to move in the channel 40 away from the front panel 22. When the locking wheels 48 are in this latter position, the insert 26 is held within the frame 14.

Near each end of the front panel 22 as shown in FIG. 1 is a mounting bolt 60 for fastening the printed board module 10 to a rack enclosure such as described in my previously cited copending patent application. The details of the mounting bolt are shown in FIG. 4. The bolt 60 passes through an aperture 66 in the front panel 22. The bolt 60 has a large knob-like head 62 at the end of the bolt that extends through the front of panel 22. A threaded portion 64 is located at the other end of the bolt 60. The bolt also passes through an aperture in a metallic ground conductor strap 68. The ground strap extends from around the bolt 60 along the rear surface of the front panel and has tabs 70 which are bent over both sides of a printed circuit board mounting structure 72. The mounting structure has an aperture aligned with a similar aperture 74 in the ground strap tab 70. The first printed circuit board 12 and the frame 14 are attached to the front panel 22 at opposite sides of the mounting structure 72 by means of a bolt or screw going into the aperture 74. When the respective circuit board 12 or frame 14 is fastened against the mounting structure 72, it comes into electrical contact with the grounding strap 68.

The bolt 60 also passes through a compression spring 76 held onto the bolt by a pin 78 which is press fit into an aperture that extends radially through the shaft of the bolt near the threaded portion 64. When the bolt 60 is fastened to the printed circuit board enclosure to hold the module in the enclosure, electrical connection is made to the enclosure by a path from the bolt through the compression spring 76 and ground strap 68 to both the printed circuit board 12 and the frame 14. Additional means may be provided to interconnect the second printed circuit board 28 on the insert 26 to either the frame or the front panel 22 to provide grounding of that printed circuit board against electrostatic discharge. A foil backed label 23 may be applied to the front surface of panel 22. That label may be electrically connected to the ground strap 68 so as to shield the module 10 from an electrostatic discharge caused by the operator touching the front panel 22.

As noted with respect to FIG. 1, the front panel 22 has an aperture with a battery holder 24 extending therethrough. The battery holder may be mounted on either of the printed circuit boards 12 or 28 to provide electrical power for maintaining various solid state memories on that printed circuit board when the main power to the module is turned off. As shown in FIGS. 5 and 6, the battery holder comprises a stepped cylindrical housing 80 formed of any of several nonconductive plastic materials. The housing 80 has three support legs 84 (one being on the other side of the housing 80 and not visible in FIG. 5). Housing 80 has a cylindrical aperture 86 therein for containing a small cylindrical battery 87. At the bottom of the cylindrical aperture at one end of the housing 80 is a metallic button terminal 88 for making contact to the positive terminal of battery 87 inserted in the holder. The interior portion of contact 88 is within a recess 90 in the end wall 92 of the battery holder. This recess for the terminal 88 prevents the generally flat negative terminal of the battery from touching positive contact 88 should the battery 87 be placed incorrectly into the battery holder. The outer portion of contact 88 is electrically connected to a positive lead 94.

The open end 96 of the battery housing 80 has internal threads. A battery holder plug 82 is shown in an assembled state in the figures and lies within the open end 96 of the housing 80. The plug 82 consists of a plastic knurled endcap 98 having a screw driver slot 100 across its end face. The slot 100 may be omitted to prevent overtightening of the plug 82 when a screw driver is used. Attached to the inner major face of the endcap 98 is an electrically conductive closed cylinder 102 having its closed end attached to the endcap 98. The cylinder 102 has an exterior threaded portion 104 which threads into the interior threads in the open end 96 of the battery housing 80. The electrically conductive cylinder 102 serves to hold the negative end of cylindrical battery 87 and has two battery gripping fingers 105 at its open end which are biased slightly inward so as to grasp the battery when it is inserted into the cylinder. A negative battery contact 106 which is shaped much like a rivet, extends through an aperture in the center of the closed end of the battery cylinder 102 into an aperture in the interior face of the holder plug 82. Element 106 contacts the negative terminal of battery 87 and is an electrical contact with the closed cylinder 102.

When the closed cylinder 102 is fully inserted within the battery holder 24, it comes into contact with a loop portion of a negative lead 107 which is located on the bottom portion 108 of the housing 80. The loop portion 108 extends through an aperture in the bottom of the housing 80 and is biased inwardly to contact a portion of the closed cylinder 102 providing an exterior electrical path from the negative terminal of battery 87 placed within the housing 80.

It is to be noted that the battery holder 24 does not contain a spring to bias the battery 87 against either the positive or the negative terminal contact 88 or 106. It has been found that the springs allow the mass of the battery to float or move under vibration of the printed circuit board module 10 which momentarily breaks the electrical contact. This break in electrical contact even though for a relatively short period of time is often sufficient to result in the erasure of the contents stored in the solid state memories connected to the battery. Therefore, the present battery holder 24 has eliminated the conventional springs and relies solely upon the force applied by screwing the battery holder plug 82 into the housing to slightly compress the battery 87 against both the positive and negative terminal contacts 88 and 106 respectively. In addition, the design of the holder allows the use of conventional cylindrical batteries and access to the battery holder from the front panel 22 of the printed circuit board module 10.

I claim:

1. A printed circuit board module comprising:
   a first printed circuit board;
   a frame substantially parallel to and spaced from said first printed circuit board, said frame having two opposed legs extending from a connecting member forming a central opening therebetween, each of said legs having an interior edge facing the other leg;
   a frame insert removably held within the central opening of said frame; and
   a second printed circuit board attached to said frame insert.

2. The module as in claim 1 wherein said frame includes a plurality of aligned support tabs spaced from one another along each of two opposed interior edges of the frame; and at least one projection extending from each of said opposed interior edges spaced from said support tabs to form a separate channel extending longitudinally along each of said edges.

3. The module as in claim 2 wherein said frame insert comprises a member having two opposed edges which when assembled into the frame are adjacent said interior edges, said insert edges each having a plurality of locking tabs spaced from each other along the length of each insert edge, the length of the locking tabs being less than the spacing between the support tabs, the thickness of the locking tabs being smaller than the width of the channel so as to permit the insert to slide along said channel.

4. The module as in claim 3 further including means to releasably secure the insert from sliding along said channels to a position where the locking tabs are between the support tabs.

5. The module as in claim 1 wherein said frame includes at least one support tab along each of two opposed interior edges of the frame; and at least one projection extending from each of said opposed interior edges spaced from said support tab to form a channel extending longitudinally along said edge.

6. The module as in claim 5 wherein said frame insert comprises a member having two opposed edges which when assembled into the frame are adjacent said interior edges, said insert edges each having at least one locking tab, the thickness of the locking tabs being smaller than the width of the channel so as to permit the insert to slide along said channel.

7. The module as in claim 1 further including a battery holder attached to one of said printed circuit boards, said battery holder comprising:
   a tubular main housing having an open end with internal fastening means, and a closed end with a recess on its interior surface;
   a first electrical contact within said recess and extending through the closed end; and
   a plug adapted to fit within the open end of said main housing and to releasably engage said fastening means, said plug having a second electrical contact.

8. A printed circuit board module comprising a frame having a set of aligned support tabs spaced from one another along each of two opposed interior edges of the frame, at least one projection extending from each of said opposed interior edges and spaced from said set of support tabs to form a channel therebetween extending longitudinally along each of said edges;

a frame insert removably supported by said frame for holding a printed circuit board, said insert having opposed edges with locking tabs extending therefrom, the tabs on each edge positioned so that they fit between the spaced tabs on an edge of said frame enabling the insert to fit into the frame and slide along the channel; a printed circuit board attached to said frame insert; and means for locking the insert into the frame.

9. The module as in claim 8 wherein the locking means comprises means for preventing movement of said insert along the channel when the locking tabs of the insert are engaging the support tabs.

10. The module as in claim 9 wherein the means for preventing movement comprises a D-shaped wheel pivotally mounted on a member of the frame that extends between the opposed interior edges.

11. The module as in claim 8 further including keying means for preventing a frame insert of an incorrect type from being fully inserted into said frame.

12. The module as in claim 8 wherein said module is adapted to fit into a chassis and further includes grounding means for conducting an electrostatic discharge from said module to a grounding system on the chassis.

13. A printed circuit board module comprising a frame having two substantially parallel legs and a connecting member extending across the legs at one end, each leg having an interior edge facing the other leg with two sets of spaced apart support tabs extending from the facing edge of each leg, the support tabs of one set being spaced from the support tabs of the other set in a staggered relationship to define a channel extending along the length of each edge between the two sets;

a faceplate extending between the other end of each leg; and a frame insert for supporting a first printed circuit board comprising a flat member within the frame between the two legs, said flat member having locking tabs along two opposed edges positioned to fit between one set of support tabs on the interior frame edges to enable the insert to be placed into and removed from the frame.

14. The module as in claim 13 wherein said faceplate includes:

means for attaching the module to an enclosure to provide an electrical path from said module to the enclosure; and a label attached to said faceplate and having an electrically conductive layer connected to said attaching means.

15. The printed circuit board module as recited in claim 1 further comprising a frame member extending between said legs and remote from said connecting member.

16. The module as in claim 1 further including means for attaching said frame to said first printed circuit board.

* * * * *